(12) United States Patent
Cheng et al.

(10) Patent No.: US 10,312,423 B2
(45) Date of Patent: Jun. 4, 2019

(54) LIGHT-EMITTING DEVICE AND MANUFACTURING METHOD THEREOF

(71) Applicant: EPISTAR CORPORATION, Hsinchu (TW)

(72) Inventors: Ching-Tai Cheng, Hsinchu (TW); Lung-Kuan Lai, Hsinchu (TW); Ju-Lien Kuo, Hsinchu (TW); Chun-Hua Shih, Hsinchu (TW); Hsuan-Tzu Peng, Hsinchu (TW); Yih-Hua Renn, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/679,966

(22) Filed: Aug. 17, 2017

(65) Prior Publication Data

US 2018/0053882 A1   Feb. 22, 2018

(30) Foreign Application Priority Data

Aug. 17, 2016 (TW) .............................. 105126290 A

(51) Int. Cl.
*H01L 33/50* (2010.01)
*H01L 33/58* (2010.01)
*H01L 33/60* (2010.01)
*H01L 33/62* (2010.01)

(52) U.S. Cl.
CPC ............ *H01L 33/58* (2013.01); *H01L 33/502* (2013.01); *H01L 33/60* (2013.01); *H01L 33/62* (2013.01); *H01L 2224/18* (2013.01); *H01L 2933/0033* (2013.01); *H01L 2933/0041* (2013.01); *H01L 2933/0058* (2013.01); *H01L 2933/0091* (2013.01)

(58) Field of Classification Search
CPC ....................................................... H01L 33/58
See application file for complete search history.

(56) References Cited

U.S. PATENT DOCUMENTS

| | | | | |
|---|---|---|---|---|
| 6,245,259 B1* | 6/2001 | Hohn | ................. | C09K 11/7718 252/301.36 |
| 6,774,401 B2* | 8/2004 | Nakada | ................. | H01L 33/405 257/81 |
| 8,552,448 B2* | 10/2013 | Ichikawa | ................ | H01L 33/50 257/98 |
| 9,006,761 B2* | 4/2015 | Oyamada | .............. | H01L 33/504 257/301 |
| 2008/0030860 A1* | 2/2008 | Chang | .................. | G02B 5/0215 359/599 |

(Continued)

*Primary Examiner* — Eugene Lee
(74) *Attorney, Agent, or Firm* — Patterson + Sheridan LLP

(57) ABSTRACT

A light-emitting device includes a light-emitting element, a wavelength converting layer and a light-adjusting layer. The light-emitting element has a first upper surface, a bottom surface, and a lateral surface between the first upper surface and the bottom surface. The wavelength converting layer includes a plurality of wavelength converting particles, and has a second upper surface on the first upper surface. The light-adjusting layer surrounds the lateral surface and has a first composition or a second composition. The first composition includes a first binder and a plurality of first light-diffusing particles. The second composition includes a second binder, a plurality of second light-diffusing particles, and a plurality of light-scattering particles.

22 Claims, 13 Drawing Sheets

(56) References Cited

U.S. PATENT DOCUMENTS

| | | | |
|---|---|---|---|
| 2008/0211388 A1* | 9/2008 | Okimura | H01L 33/504 |
| | | | 313/503 |
| 2009/0050911 A1* | 2/2009 | Chakraborty | H01L 33/56 |
| | | | 257/89 |
| 2009/0057699 A1 | 3/2009 | Basin et al. | |
| 2009/0236622 A1* | 9/2009 | Nishihara | H01L 33/504 |
| | | | 257/98 |
| 2009/0256166 A1* | 10/2009 | Koike | H01L 33/501 |
| | | | 257/98 |
| 2009/0309116 A1* | 12/2009 | Kato | C09K 11/7721 |
| | | | 257/98 |
| 2011/0006668 A1* | 1/2011 | Hussell | H01L 33/501 |
| | | | 313/499 |
| 2011/0248304 A1* | 10/2011 | Ichikawa | H01L 24/32 |
| | | | 257/98 |
| 2011/0248623 A1* | 10/2011 | Ichikawa | F21K 9/00 |
| | | | 313/483 |
| 2012/0098007 A1* | 4/2012 | Kuo | G02F 1/157 |
| | | | 257/98 |
| 2014/0239325 A1* | 8/2014 | Andrews | H01L 33/60 |
| | | | 257/98 |
| 2015/0014727 A1* | 1/2015 | Tchoul | C08K 9/08 |
| | | | 257/98 |
| 2015/0109775 A1* | 4/2015 | Schwalenberg | F21V 23/0457 |
| | | | 362/231 |
| 2016/0133610 A1* | 5/2016 | Reiherzer | H01L 25/0753 |
| | | | 257/98 |
| 2016/0190409 A1 | 6/2016 | Kuo et al. | |
| 2016/0240746 A1* | 8/2016 | Yun | H01L 33/56 |

* cited by examiner

LIGHT-EMITTING DEVICE AND MANUFACTURING METHOD THEREOF

CROSS-REFERENCE TO RELATED APPLICATIONS

This application claims priority to and the benefit of TW Application Number 105126290 filed on Aug. 17, 2016, and the disclosure of which is incorporated by reference in its entirety.

BACKGROUND

Technical Field

The present disclosure relates to a light-emitting device and manufacturing method thereof, and in particular to a light-emitting device having a wavelength converting layer and a light-adjusting layer.

Description of the Related Art

For the solid-state light emitting elements, light-emitting diodes (LEDs) have the characteristics of low power consumption, low heat generation, long operational life, shockproof, small volume, quick response. Therefore, light-emitting diodes have been adopted widely in demands for light emitting elements within various fields, for instance, vehicles, home appliances, and lighting lamps.

There are several approaches to convert monochromatic light emitted from LEDs to other color light. For example, one approach is to dispose a wavelength conversion layer, such as a phosphor layer, on LEDs. Phosphor is a photoluminescence material, which is also known as a wavelength conversion material. Phosphor can absorb first light emitted from LEDs and generate a second light different from the first light. If the first light is not fully absorbed by the phosphor, the remaining first light can mix with the second light to generate mixing color of light.

For different view angles, if ratios of the first light emitted from LEDs and the converted second light are different, a distribution of the color or the color temperature in the mixing light is not uniform.

Furthermore, in the approach of forming the wavelength conversion layer on LEDs, a plurality of LEDs can be covered by one wavelength conversion sheet first, and then the wavelength conversion sheet is divided to form multiple wavelength conversion layers. During the dividing step, errors might happen and cause uneven thicknesses in individual wavelength conversion layer that can lead to the uneven distribution of the color or the color temperature in the mixed light.

Moreover, because of the trend of compact size of an LED package, the distance between LEDs and the wavelength conversion layer becomes smaller so that the non-uniform effect of the mixing light in the distribution of the color or the color temperature is more serious.

SUMMARY OF THE DISCLOSURE

An embodiment of the application discloses a light-emitting device. The light-emitting device includes a light-emitting element, a wavelength conversion layer and a light-adjusting layer. The light-emitting element includes a first upper surface, a bottom surface, and a lateral surface between the first upper surface and the bottom surface. The wavelength conversion layer includes a plurality of wavelength conversion particles, and has a second upper surface on the first upper surface. The light-adjusting layer surrounds the lateral surface, and has a first composition or a second composition. The first composition includes a first binder and a plurality of first light-diffusing particles. A weight percentage of the first light-diffusing particles to the light-adjusting layer is not less than 20%. The second composition includes a second binder, a plurality of second light-diffusing particles, and a plurality of light-scattering particles. A weight percentage of the second light-diffusing particles to the light-adjusting layer is not less than 5%, and a weight percentage of the light-scattering particles to the light-adjusting layer is not less than 0.4%.

DETAILED DESCRIPTION OF THE EMBODIMENTS

Figure 1A:
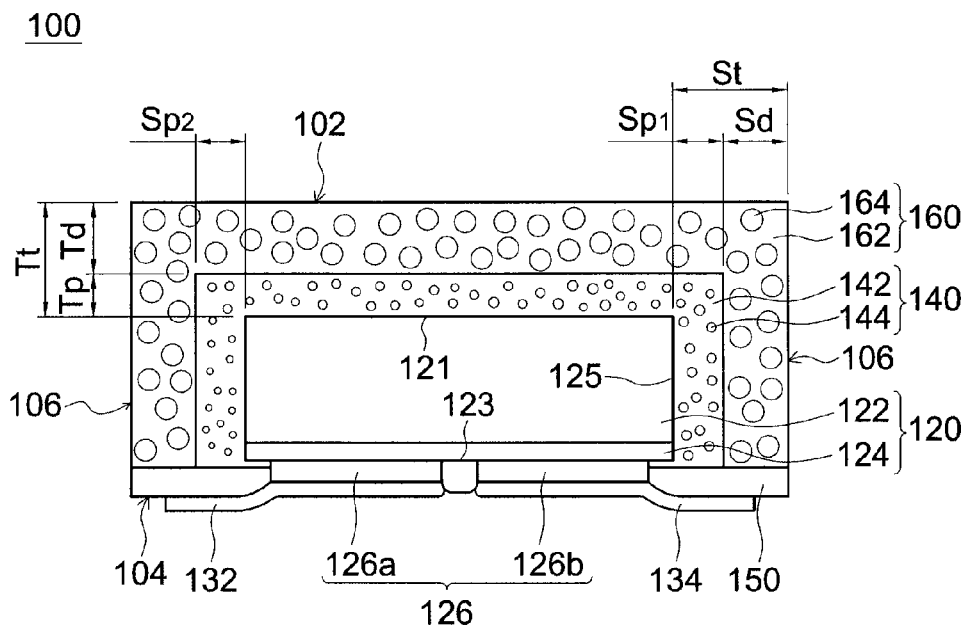
FIG. 1A is a cross sectional view of a light-emitting device in accordance with one embodiment of the present disclosure.

To better and concisely explain the disclosure, the same name or the same reference numerals given or appeared in different paragraphs or figures along the specification should has the same or equivalent meanings while it is once defined anywhere of the disclosure. In addition, these drawings are not necessarily drawn to scale. Likewise, the relative sizes of elements illustrated by the drawings may differ from the relative sizes depicted.

The following shows the description of embodiments of the present disclosure in accompany with the drawings.

In the article, the light-emitting device includes at least one light-emitting element. Furthermore, the light-emitting device has one or more total lateral thickness St, wherein the total lateral thickness St means a distance from a lateral surface of the light-emitting device to a lateral surface of the light-emitting element. The total upper thickness Tt means a distance from a top surface of the light-emitting device to an upper surface of the light-emitting element. The type or arrangement related to the lateral surface and the top surface of the light-emitting device or the lateral surface and the upper surface of the light-emitting element can refer to the description of embodiments below.

FIG. 1A is a cross-sectional view of a light-emitting device 100 in accordance with one embodiment of the present disclosure. Referring to FIG. 1A, the light-emitting device 100 includes a light-emitting element 120, a wavelength conversion layer 140, and a light-adjusting layer 160. The wavelength conversion 140 covers a part of surfaces of the light-emitting element 120. Furthermore, the light-adjusting layer 160 is located on the wavelength conversion 140. To be more specific, the light-adjusting layer 160 covers the light-emitting element 120 and the wavelength conversion 140. The light-emitting device 100 includes a top surface 102, a bottom surface 104, and a plurality of lateral surfaces 106. The lateral surfaces 106 are arranged between the top surface 102 and the bottom surface 104.

In an embodiment, the light-emitting element 120 includes a supporting substrate 122, a light-emitting layer 124, and a plurality of electrical contacts 126. Moreover, a side of the light-emitting layer 124 faces the supporting substrate 122, and another side faces the electrical contacts 126. Furthermore, the light-emitting element 120 includes an upper surface 121, a bottom surface 123, and a plurality of lateral surfaces 125 which is located between the upper surface 121 and the bottom surface 123. The supporting substrate 122 can hold or support the light-emitting layer 124. Moreover, a surface in the supporting substrate 122 is located away the light-emitting layer 124 and becomes the top surface 121 of the light-emitting element 120, which is therefore the light extracting surface of the light-emitting element 120. In one embodiment, the supporting substrate 122 is a growth substrate, such as sapphire, for light-emitting structure 124 being epitaxially grown on. In another embodiment, the supporting substrate 122 is not the growth substrate which can be removed or replaced by another substrate (different material, different structure or different shape) during the back-end process of the manufacture of the light-emitting device 100.

In an embodiment, the light-emitting layer 124 includes a first semiconductor layer, an active layer and a second semiconductor layer (not shown). In an embodiment, the first semiconductor layer can be an n-type semiconductor layer and the second semiconductor layer can be a p-type semiconductor layer. In an embodiment, electrical contacts 126 includes two electrical contacts 126a and 126b disposed on the same side of the light-emitting element 120 as an interface to electrically connect the light-emitting element 120 and an external power. Moreover, the bottom surface 123 does not include surfaces of electrical contacts 126a and 126b. Therefore, in FIG. 1A, the bottom surface 123 refers to the bottom surface of the light-emitting layer 124 and the interface between the light-emitting layer 124 and the electrical contacts 126a and 126b. Moreover, electrical contacts 126a and 126b can be electrically connected to the first semiconductor layer and the second semiconductor layer, respectively. Both of electrical contacts 126a and 126b can be extended to an elevation higher than a bottom surface of the wavelength conversion layer 140 or to an elevation close to the bottom surface (not shown), or only one of the electrical contacts extended to an elevation higher than the bottom surface (not shown). The lateral surfaces 125 include a side surface of the supporting substrate 122 and that of the light-emitting layer 124 as light extracting surfaces of the light-emitting element 120. In one embodiment, the light-emitting element 120 has four lateral surfaces 125 while those surfaces opposite to each other are parallel to each other. In other words, an appearance of the light-emitting element 120 is rectangle or parallelogram. The top surface 121 is substantially parallel to a part of the bottom surface 123.

In an embodiment, the light-emitting element 120 can be an LED flip-chip. In another embodiment, the light-emitting element 120 can be a vertical LED chip with electrical contacts 126a and 126b arranged on the two opposite sides of the LED chip, and electrical contacts 126a and 126b can be electrically connected to the first semiconductor layer and the second semiconductor layer, respectively.

In an embodiment, the light-emitting element 120 can be an LED chip, such as blue LED chip or UV LED chip. In one embodiment, the light-emitting element 120 is a blue LED chip which can emit a light having a dominant wavelength or a peak wavelength in the range of 430 nm and 490 nm. In another embodiment, the light-emitting element 120 is violet LED chip which can emit a light with a dominant wavelength or a peak wavelength in the range of 400 nm and 430 nm.

The wavelength conversion layer 140 can include transparent binder 142 and a plurality of wavelength conversion particles 144 dispersed within the transparent binder 142. The wavelength conversion particles 144 can absorb a part or all first light from the light-emitting element 120 to convert to second light with different wavelength or spectrum. The color of the second light can be green, yellowish green, yellow, amber, reddish orange, or red. In one embodiment, the wavelength conversion particles 144 absorb first light, such as blue light or UV light, and then convert to second light as yellow light with a dominant wavelength or a peak wavelength in the range of 530 nm and 590 nm. In another embodiment, the wavelength conversion particles 144 absorb first light, such as blue light or UV light, and then convert to second light as yellowish green light with a dominant wavelength or a peak wavelength in the range of 515 nm and 575 nm. In another embodiment, the wavelength conversion particles 144 absorb first light, such as blue light or UV light, and then convert to second light as red light with a dominant wavelength or a peak wavelength in the range of 590 nm and 670 nm.

The wavelength conversion layer 140 can include single or different kinds of wavelength conversion particles 144. In one embodiment, the wavelength conversion layer contains the wavelength conversion particles 144 capable of emitting yellow light. In another embodiment, the wavelength conversion layer 140 has different kinds of wavelength conversion particles 144 capable of emitting green light and red light. Therefore, in addition to the second light that emits green light, there is the third light that emits red light and can be mixed with a part of the first light that is not absorbed. In another embodiment, the first light is absorbed completely or mostly by the wavelength conversion particles of the wavelength conversion layer 140. Here, "absorbed mostly" means the light intensity of the first light in the peak wavelength is less than 3% of that of the second light in the peak wavelength and/or the third light in the mixed light.

The wavelength conversion particles 144 can be distributed in the transparent binder 142 which can fix the wavelength conversion particles in relative positions and conduct heat from the wavelength conversion particles 144. The concentration of the wavelength conversion particles 144 within the wavelength conversion layer 140 can be changed by adjusting the weight ratio of the transparent binder 142 and the wavelength conversion particles 144. The higher the concentration of the wavelength conversion particles 144 is the more light from light in the light-emitting element 120 is converted to another light, which means higher conversion ratio. Furthermore, when a weight ratio of the wavelength conversion particles 144 to the wavelength conversion layer 140 is less than 70%, the higher a weight ratio of the wavelength conversion particles 144 to the wavelength conversion layer 140 is, the more light is scattered. If the concentration of the wavelength conversion particles 144 is too high, the transparent binder 142 cannot fix the wavelength conversion particles 144 effectively because there is no sufficient of the transparent binder 142. In one embodiment, a weight percentage of the wavelength conversion particles 144 to the wavelength conversion layer 140 is less than 70%. In another embodiment, a weight percentage of the wavelength conversion particles 144 to the wavelength conversion layer 140 is in the range of 20% and 60%. The wavelength conversion particles 144 in the above-mentioned range of the weight percentage can provide a better conversion ratio and scattering effect, and be fixed effectively in the position. In addition, the transparent binder 142 can have a higher transparency, such as 80%, 90%, 95% or 99% transparency so that the first light that excites the wavelength conversion particles 144 and the second light emitted from the wavelength conversion particles 144 have higher light extraction efficiency.

The transparent binder 142 can be a thermosetting resin, for example, an epoxy resin or a silicone resin. In an embodiment, the transparent binder 142 is silicone resin. Moreover, a composition of the silicone resin can be adjusted depending on the required physical properties or optical properties. In one embodiment, the transparent binder 142 contains silicone having aliphatic group, such as methyl siloxane, with a greater ductility so as to sustain thermal stress from the light-emitting element 120. In another embodiment, the transparent binder 142 has silicone having aromatic group, such as phenyl siloxane, with a higher refractive index so as to increase light extraction efficiency. The smaller the difference of refractive indices between the transparent binder 142 and a material of the light extracting surface of the light-emitting element 120 is, the larger the angle of output light is so that light extraction efficiency can be increased. In one embodiment, the material of the light extracting surface of the light-emitting element 120 is sapphire which has a refractive index about 1.77, and the transparent binder 142 has the silicone having aromatic group with a refractive index greater than 1.50.

Material of the wavelength conversion particles 144 can include inorganic phosphor, organic fluorescent colorants, semiconductors, or combinations thereof. The semiconductor material includes crystal size in a nano-scale thereof, such as quantum dot luminescent material. In one embodiment, the material of the wavelength converting particles 144 is phosphor, and the phosphor can be $Y_3Al_5O_{12}$:Ce, $Gd_3Ga_5O_{12}$:Ce, $(Lu, Y)_3Al_5O_{12}$:Ce, $Tb_3Al_5O_{12}$:Ce, SrS:Eu, $SrGa_2S_4$:Eu, (Sr, Ca, Ba)(Al, Ga)$_2S_4$:Eu, (Ca, Sr)S:(Eu, Mn), (Ca, Sr)S:Ce, (Sr, Ba, Ca)$_2Si_5N_8$:Eu, (Sr, Ba, Ca)(Al, Ga)Si $N_3$:Eu, CaAlSiON:Eu, (Ba, Sr, Ca)$_2SiO_4$:Eu, (Ca, Sr, Ba)$Si_2O_2N_2$:Eu, $K_2SiF_6$:Mn, $K_2TiF_6$:Mn, and $K_2SnF_6$:Mn.

The semiconductor material can include II-VI semiconductor compound, III-V semiconductor compound, IV-VI semiconductor compound, or combinations thereof. The quantum dot luminescent material can include a core as emitting light and a shell encapsulating the core. The material of the core can be ZnS, ZnSe, ZnTe, ZnO, CdS, CdSe, CdTe, GaN, GaP, GaSe, GaSb, GaAs, MN, AlP, AlAs, InP, InAs, Te, PbS, InSb, PbTe, PbSe, SbTe, ZnCdSeS, and CuInS. The material of the shell has to be coordinated with that of the core in material or mechanical property, for example, the lattice constants of the core and the shell are matched with each other. In an embodiment, the core is CdSe and the shell is ZnS. The shell structure can be single layer, multi-layer or gradient composition.

The wavelength conversion layer 140 can cover one or more light extracting surfaces of the light-emitting element 120. In one embodiment, the light extracting surfaces of the light-emitting element 120 include a top surface 121 and lateral surfaces 125 and the wavelength conversion layer 140 covers the top surface 121 and the lateral surfaces 125. In one embodiment, the wavelength conversion layer 140 directly contacts the top surface 121 and the lateral surfaces 125 of the light-emitting element 120. In one embodiment, in addition to covering the top surface 121 and the lateral surfaces 125 of the light-emitting element 120, the wavelength conversion layer 140 bends in the lower portion of the lateral surface 125 and extends along the bottom surface of the light-adjusting layer 160 outward the outer surface of the light-adjusting layer 160 to form an end portion (not shown). The end portion can be coplanar with the outer surface of the light-adjusting layer or be covered by that.

The light-adjusting layer 160 is formed on the light-emitting element 120 and the wavelength conversion layer 140, so as to remix the mixed light from the light-emitting element 120 and the wavelength conversion layer 140 to form a mixed light with a more uniform color distribution. Specifically, before the light emitted from the light-emitting element 120 and the wavelength conversion 140 with multiple spectrums enters the light-adjusting layer 160, the light is initially mixed in the wavelength conversion layer 140. When the initially mixed light passes through the light-adjusting layer 160, it is mixed evenly after being refracted, reflected and scattered so the uniformity of the color distribution over angle of view is increased. The uniformity of the color distribution over angle of view can be determined by the diagram with the divergence of the color coordinate $\Delta u'v'$ as a function of the angle of view. The coordinate X indicates the angle of view, wherein 0° is corresponding to a direction vertical to the top surface 121 while 90° and −90° are respectively corresponding to two opposite directions parallel to the top surface 121. The coordinate Y indicates the distance between an arbitrary point (target point) and a reference point $(u_0', v_0')$ on the CIE1976 color space, wherein the reference point $(u_0', v_0')$ is defined as the average value of the color coordinates over all angles of the emitted light. In addition, u' and v' indicate the color coordinates of the target point on the CIE1976 color space, and $\Delta u'v'=(\Delta u'^2+\Delta v'^2)^{1/2}$, $\Delta u'=u'-u_0'$, $\Delta v'=v_0'$. In that case, the larger $\Delta u'v'$ means the distance between the target point and the reference point is larger and the mixing ratio of the first light and the second light has larger difference with the average value. If $\Delta u'v'$ is smaller, the uniformity of the color distribution over angle of view is better. In one embodiment, the light-adjusting layer 160 includes a binder 162 and a plurality of light-diffusing particles 164 (first composition). Moreover, a weight percentage of the light-diffusing particles to the light-adjusting layer 160 is not less than 20%.

The weight percentage thereof prefers the range of 30% to 50%. The weight percentage herein means as a percentage of a weight of specific substance to a weight of all substance in the light-adjusting layer 160. In one embodiment, the light-adjusting layer 160 only includes the binder 162 and the plurality of light-diffusing particles 164 so that the total weight of the light-adjusting layer 160 is the sum of the weight of the binder and that of the light-diffusing particles. In another embodiment, besides the binder 162 and the light-diffusing particles 164, the light-adjusting layer 160 has other additives, such as the dispersant. The dispersant can be silane. Therefore, the total weight of the light-adjusting layer 160 is the sum of the weights of the binder, the light-diffusing particles, and the dispersant. Furthermore, the method of measuring the weight percentage can be thermogravimetric analysis (TGA).

Figure 1B:
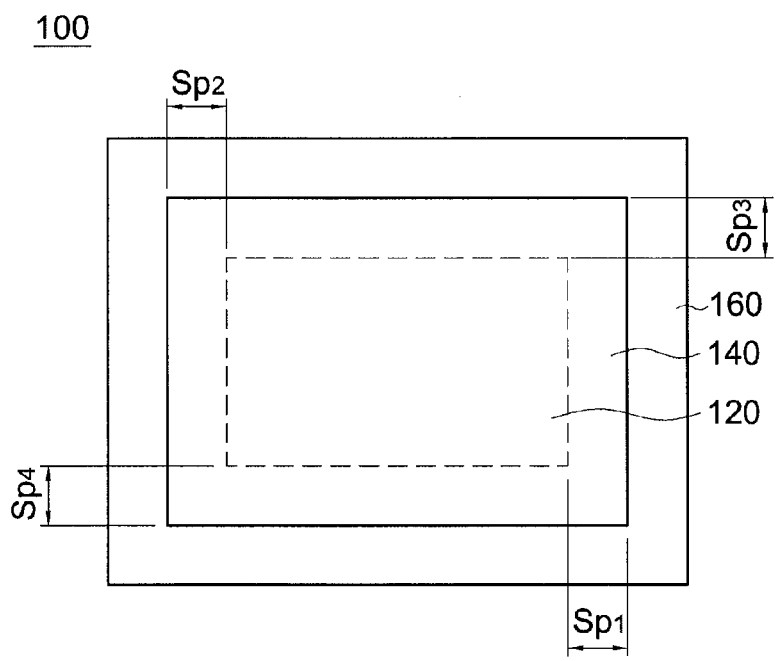
FIG. 1B is a top view of the light-emitting device shown in FIG. 1A.

Referring to FIG. 1B, in an embodiment, the light-emitting device can maintain a good uniformity of the color distribution over angle of view when the weight percentage of the light-diffusing particles 164 to the light-adjusting layers 160 is not less than 20% and the variation between individual lateral thickness and an average of the lateral thicknesses $S_{p1}$, $S_{p2}$, $S_{p3}$, $S_{p4}$ is greater than 10%. When the angle of view is in a range of 0° to 70°, Δu'v' is less than 0.010. In another embodiment, the variation of each lateral thickness and the average of all lateral thicknesses $S_{p1}$, $S_{p2}$, $S_{p3}$, $S_{p4}$ is ranged from 10% to 30%, wherein the variation is defined as a percentage of the absolute value of the difference between a lateral thickness and the average of all lateral thicknesses divided by the average of all lateral thicknesses.

Referring to FIG. 1A, a material of the binder 162 can be the same, similar or different from the transparent binder 142. If the material of the binder 162 is the same or similar to the transparent binder 142, the bonding effect between the light-adjusting layer 160 and the wavelength conversion layer 140 is better. The identical or similar material can have identical or similar properties in chemical. For example, both are polymer and have the same or similar polarity. In an embodiment, the binder 162 and the transparent binder 142 are both silicone resin. The material of the binder 162 can refer to the related paragraph in the description of the transparent binder 142.

The light emitted from the light-emitting element 120 and the wavelength conversion layer 140 can passed through the light-diffusing particles 164. Material of the light-diffusing particles 164 can be silica. The size of the light-diffusing particles 164 can affect the diffusion of light. In general, the light-diffusing particles with the smaller size can enhance the light scattering while the light-diffusing with the larger size can allow the light to pass through. In one embodiment, the average particle size of the light-diffusing particles 164 is not greater than 10 μm. In another embodiment, the light-adjusting layer 160 has two particle sizes: one size has the average particle size ranged from 1 μm to 10 μm, and the other one has the average particle size ranged from 15 μm to 50 μm. Moreover, in an embodiment, the refractive index of the light-diffusing particles 164 is between 1.45 and 1.48. The refractive index of the light-diffusing particles 164 and that of the binder 162 can be the same or different. In one embodiment, the refractive index of the binder 162 is greater than that of the light-diffusing particles 164 and difference between the two of less than 0.1.

Furthermore, an outer surface of the light-adjusting layer 160 can be used as a light extraction surface of the light-emitting device 100. In one embodiment, the refractive index of the supporting substrate 122 is ranged from 1.76 to 1.82, that of the wavelength conversion layer 140 is ranged from 1.52 to 1.76, and that of the light-adjusting layer 160 is ranged from 1.40 to 1.60.

In another embodiment, the light-adjusting layer 160 can further include a plurality of light-scattering particles (not shown) and the plurality of light-scattering particles can enhance the effect of light mixing by reflecting or scattering light. In one embodiment, the light-scattering particles are dispersed within the binder 162. In one embodiment, the refractive index of the light-scattering particles is greater than that of the light-diffusing particles. In one embodiment, the refractive index of the light-scattering particles is greater than that of the light-diffusing particles of 0.5. Furthermore, in an embodiment, the light-diffusing particles 164 can be silica. If the light-scattering particles are white pigment such as titanium oxide, the light-adjusting layer 160 also changes color in the appearance of the light-emitting element 100. When the light-emitting device 100 is used for the electronic product, such as computer or mobile phone, the color of the light-emitting device 100 can be close to color of the appearance in the electronic product so as to reduce the difference from color of the appearance between the light-emitting device 100 and the electronic product. The weight percentage of light-scattering particles can be adjusted by the demand of mixing light and color. Moreover, the light-scattering particles can help to uniformly mix light emitted from the light-emitting element 120 and converted by the wavelength conversion layer 140 so the consumed amount of the light-diffusing particles 164 can be decreased. In one embodiment (the second composition), the weight percentage of the light-diffusing particles 164 to the light-adjusting layer 160 is not less than 5% and the weight percentage of the light-scattering particles is not less than 0.4%. In another embodiment, the weight percentage of the light-diffusing particles 164 is ranged from 5% to 20%, and that of the light-scattering particles is ranged from 0.4% to 3%. If the weight percentage of the light-scattering particles is greater than 5%, the probability of the light absorbed by the light-emitting device 100 can be decreased. Therefore, the light intensity of the light-emitting device 100 can be reduced.

The size of the light-emitting device 100 can affect the uniformity of the color distribution over angle of view. Specifically speaking, when the length and width of the light-emitting device 100 and the total lateral thickness $S_t$ are smaller, the uniformity of the color distribution over angle of view is worse. The total lateral thickness $S_t$ is defined as the sum of the individual lateral thickness $S_{p1}$ or $S_{p2}$ of the wavelength conversion layer 140 and the lateral thickness $S_d$ of the light-adjusting layer 160, i.e. $S_{p1}+S_d$ or $S_{p2}+S_d$. In other words, the total lateral thickness $S_t$ herein means a distance from the lateral surface 106 (outmost surface) of the light-emitting device 100 to corresponding lateral surface 125 of the light-emitting element 120. In one embodiment, the light-emitting device 100 is a hexahedral structure, and a length and a width of the light-emitting device 100 refer to largest distances respectively between two opposite lateral surfaces 106. In one embodiment, when the length of the light-emitting device 100 and the width thereof are both less than 2.5 mm and the total lateral thickness $S_t$ is less than 0.35 mm, the weight percentage of the light-diffusing particles 164 to the light-adjusting layer 160 is less than 20% and has a better uniformity of the color distribution over angle of view. In another embodiment, when the length of the light-emitting device 100 and the width thereof both are less than 2.0 mm and the total lateral thickness St is less than 0.25 mm, the weight percentage of the light-diffusing particles 164 to the light-adjusting layer 160 is between 30% and 50%.

An upper thickness $T_p$ and the lateral thickness $S_{p1}$, $S_{p2}$ of the wavelength conversion layer 140 can also affect the uniformity of the color distribution over angle of view. In one embodiment, when the upper thickness $T_p$ is greater than the individual lateral thickness $S_{p1}$, $S_{p2}$, the uniformity of the color distribution over angle of view is better than that when the upper thickness $T_p$ is equal to the individual lateral thickness $S_{p1}$, $S_{p2}$. In one embodiment, ratios of the upper thickness $T_p$ to the individual lateral thickness $S_{p1}$, $S_{p2}$ can be ranged from 1.5 to 2.5.

Ratios of an upper thickness $T_p$ of the wavelength conversion layer 140 to an upper thickness $T_d$ of the light-adjusting layer 160 in a total top thickness $T_t$ in the light-emitting device 100 can also affect the uniformity of the color distribution over angle of view. The total top thickness $T_t$ is herein defined as the sum of the upper thickness $T_p$ in the wavelength conversion layer 140 and the upper thickness $T_d$ in the light-adjusting layer 160. In one embodiment, ratios of the upper thickness $T_p$ in the wavelength conversion layer 140 to the upper thickness $T_d$ in the light-adjusting layer 160 can be ranged from 0.8 to 2.4.

Referring to FIG. 1A, a lower surface of the wavelength conversion layer 140 and that of the light-adjusting layer 160 can be covered by the light-reflecting layer 150. The light-reflecting layer 150 can reflect the light emitted from the light-emitting element 120 and the light emitted from the wavelength conversion layer 140 directing to the light extracting surface. In an embodiment, the wavelength conversion layer 140 directly contacts the light-reflecting layer 150. The light-reflecting layer 150 can be made by light-reflecting and non-conductive material. In one embodiment, the light-reflecting material can be $TiO_2$, $ZrO_2$, $Nb_2O_5$, $Al_2O_3$, $SiO_2$, $MgF_2$ or $Al_2N_3$. In another embodiment, the light-reflecting material is a mixture of the particle of above-mentioned material and binding agent. The binding agent can be silicone resin, acrylic resin, or epoxy resin. In one embodiment, the light-reflecting layer 150 can be formed by screen printing.

Referring to FIG. 1A, lower surfaces of electrical contacts 126a and 126b can be covered by extension pads 132 and 134 respectively. In an embodiment, the extension pads 132 and 134 cover the electrical contacts 126a, 126b and a portion of the light-reflecting layer 150. As the figure shows, the extension pads 132 and 134 extend inward to close each other, and extend outward to a position behind the outer boundary of the light- reflecting layer 150. However, the extension pads 132 and 134 also extend to the outer boundary of the light-reflecting layer 150 (not shown). In an embodiment, the surface area of the extension pad 132 is greater than the surface area of the electrical contact 126a and/or the surface area of the extension pad 134 is greater than the surface area of the electrical contact 126b. In one embodiment, the thickness of the light-reflecting layer 150 is greater than the respective thickness of the electrical contacts 126a and 126b. When the extension pads 132, 134 extend to upside of the light-reflecting layer 150 from the electrical contacts 126a and 126b, the extension pads 132, 134 respectively forms an inclined plane because of a gap between the light-reflecting layer 150 and the electrical contacts 126a and 126b. In another embodiment, the electrical contacts 126a and 126b are coplanar (not shown) with the light-reflecting layer 150 so the inclined plane does not exist. Extension pads 132, 134 are made of high electrically conductive material, such as Cu, Ag or Au. In an embodiment, the extension pads 132, 134 can be formed by electroplating.

Figure 2A:
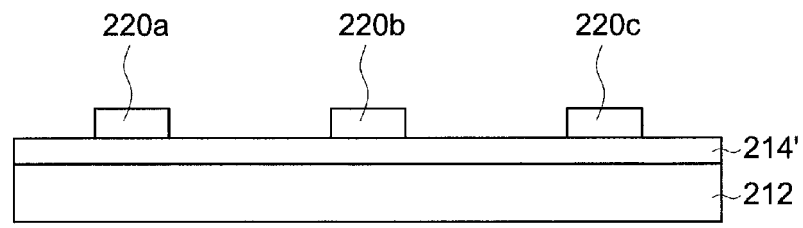
FIGS. 2A~2F illustrate a manufacturing flow of the light-emitting device in accordance with one embodiment of the present disclosure.

FIGS. 2A~2F illustrate a manufacturing flow of the light-emitting device 100 in accordance with one embodiment of the present disclosure. Referring to FIG. 2A, a temporary carrier 212, light-emitting elements 220a, 220b, 220c, and an adhesive layer 214' that can fix the light-emitting elements 220a, 220b, 220c on the temporary carrier 212 are provided. The number of the light-emitting elements is an example and is not limited to three. In one embodiment, the temporary carrier 212 can be glass, sapphire substrate, metal plate or plastic plate. Furthermore, the temporary carrier 212 has a flat surface to facilitate the following cutting or the alignment processes. The adhesive layer 214' can be UV curing resin. At this stage, the adhesive layer 214' is not curing completely and remains sticky.

Figure 2B:
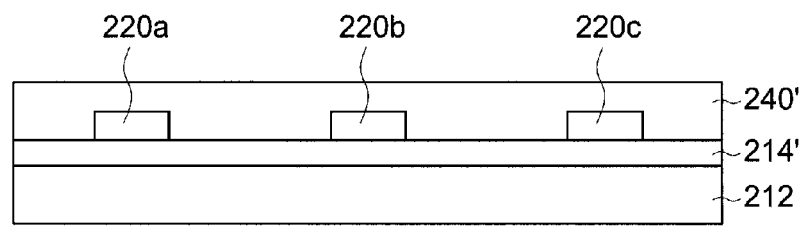

Referring to FIG. 2B, a wavelength conversion sheet 240' is formed on the adhesive layer 214' and covers the light-emitting elements 220a, 220b, 220c. The wavelength conversion sheet 240' is a preformed sheet structure which is mixed by the plurality of wavelength conversion particles and the transparent binder. The size of the sheet structure can be adjusted based on the requirement, for example, the sheet structure includes the plurality of wavelength conversion sheets, and each of the wavelength conversion sheets is separated from each other. The plurality of separated wavelength conversion sheets covers the plurality of light-emitting elements correspondingly as a batch or in order, which means one of the wavelength conversion sheets 240' only covers one or few light-emitting elements. For example, the number of light-emitting element is smaller than 1/50, 1/100, or 1/200 of all light-emitting elements disposed on the temporary carrier 212. In another embodiment, the sheet structure is formed as a tape which can continuously cover the plurality of light-emitting elements in one step. In other words, one wavelength conversion sheet 140' can cover multiple or all light-emitting elements. For example, the number of light-emitting element is more than 1/50, 1/100, or 1/200 of all light-emitting elements disposed on the temporary carrier 212. In an embodiment, the wavelength conversion sheet 140' is laminated on the top of the light-emitting elements 220a, 220b, 220c. The lamination is made by tightly sealing an upper mold (the wavelength conversion sheet can be deposed on the upper mold, not shown) and a lower mold (the light-emitting element can be deposed on the lower mold, not shown), and heating and providing the pressure to the wavelength conversion sheet 240' at the same time so as to soften the wavelength conversion sheet 240' connecting to the light-emitting elements 220a, 220b, 220c tightly. At this stage, the wavelength conversion sheet 240' is not curing completely. In an embodiment, the wavelength conversion sheet 240' further includes a substrate (not shown) to support the wavelength conversion sheet 240' when the wavelength conversion sheet 240' is disposed on the light-emitting elements 220a, 220b, 220c. Material of the substrate can be polymer, such as polyethylene or polyester.

Figure 2C:
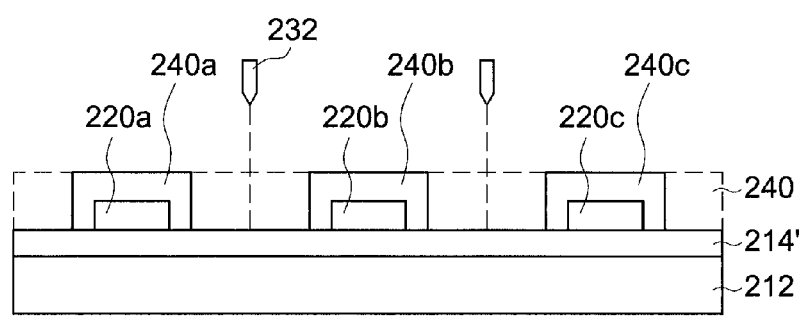

Referring to FIG. 2C, in the first separation step, the wavelength conversion sheet 240 is divided into a plurality of wavelength conversion layers 240a, 240b, 240c. Before the first separation step, the uncured wavelength conversion sheet 240' can be cured to form the wavelength conversion sheet 240. In one embodiment, the wavelength conversion sheet 240' is cured by heating. In another embodiment, the wavelength conversion sheet 240' is cured by other energy form, such as irradiation. The separation process includes cutting the wavelength conversion sheet 240 and the adhesive layer 214' to form a dicing groove by a cutting tool 232.

Figure 2D:
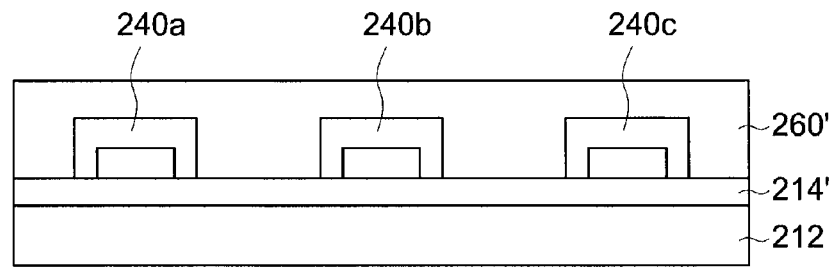

Referring to FIG. 2D, a light-adjusting layer 260' is formed on the wavelength conversion sheets 240a, 240b, 240c and the temporary carrier 212. In one embodiment, the light-adjusting layer 260' can cover all the upper surface and the side walls of the wavelength conversion layers 240a, 240b, 240c. Furthermore, the light-adjusting layer 260' directly contacts a surface of the adhesive layer 214'. The forming method of the light-adjusting layer 260' can be molding, heating, or pressing so the light-adjusting layer 260' covers the top surface of the wavelength conversion sheet 140' and fills in the concave portion or the dicing groove between the light-emitting elements 120a and 120b. In another embodiment, the light-adjusting layer 260' is formed by coating or laminating a sheet. In an embodiment, the light-adjusting layer 260' is in the semi-curing state, which is also called B-stage resin. In one embodiment, the light-adjusting layer 260' can be cured by heating. The light-adjusting layer 260' is transferred to a fully cured condition, which is also called the C-stage. In another embodiment, the light-adjusting layer 260' is cured by other energy forms such as light. The light-adjusting layer 260' is preformed as a sheet structure by mixing the plurality of light-diffusing particles and the binder, and the sheet structure is arranged on the wavelength conversion layer 240a, 240b, 240c so as to form the light-adjusting layer. In another embodiment, after mixing the plurality of light-diffusing particles and the binder, the mixture of the plurality of light-diffusing particles and the binder can be directly coated on the wavelength conversion layer 240a, 240b, 240c as the light-adjusting layer 260'.

Figure 2E:
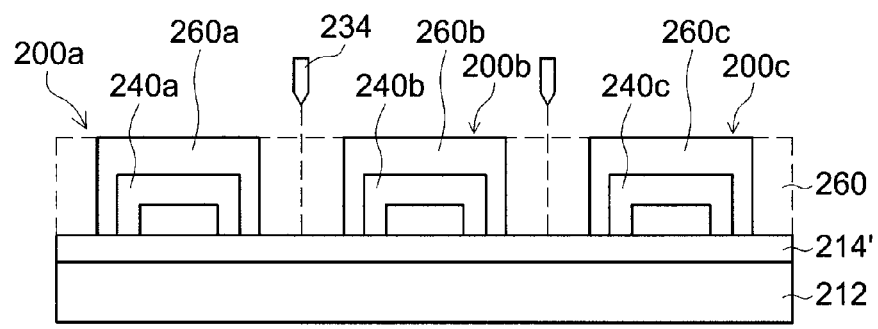

Referring to FIG. 2E, the light-adjusting layer 260 is divided into a plurality of light-adjusting layers 260a, 260b, 260c in a second separation step. In one embodiment, a plurality of light-emitting devices 200a, 200b, 200c can also be formed at this step. The second separation step process includes cutting the light-adjusting layer 260 by a cutting tool 234. In one embodiment, the cutting tool used in the second separation step has a smaller width than that in the first separation step so as to form a narrower dicing groove. Therefore, the light-adjusting layers 260a, 260b, 260c can surround the wavelength conversion layers 240a, 240b, 240c.

Figure 2F:
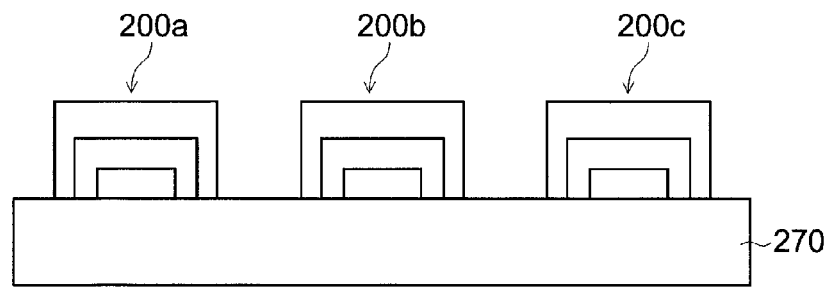

Referring to FIG. 2F, the energy such as irradiating energy or thermal energy is provided to reduce or remove the stickiness of the adhesive layer 214'. In one embodiment, the adhesive layer 214' is UV curing resin, and the temporary carrier 220 is transparent material, such as glass, sapphire, and so on. At this stage, UV light is irradiated from the direction of the temporary carrier so that the UV curing resin is cured to decrease the stickiness. In another embodiment, the adhesive layer 214' can be thermosetting curing resin and the stickiness is decreased by heating. Afterwards, the light-emitting devices 200a, 200b, 200c are transferred to another temporary carrier 270. In the transfer step, the light-emitting devices 200a, 200b, 200c can be placed on another temporary carrier 270 by picking. The temporary carrier 270 can be blue tape. In another embodiment, the light-emitting devices 200a, 200b, 200c can be sequentially placed onto a reel.

Figure 3A:
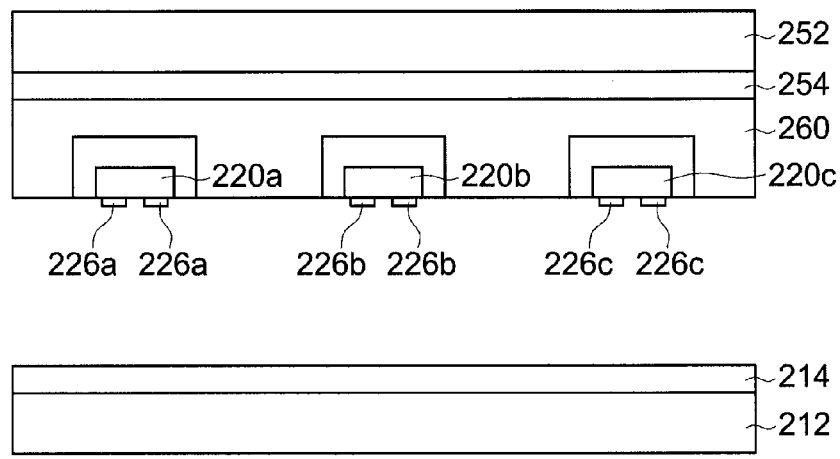
FIGS. 3A~3D illustrate a manufacturing flow of the light-emitting device in accordance with another embodiment of the present disclosure.

Referring to FIG. 1A, the light-reflecting layer 150 and the extension pads 132, 134 can be further formed on the bottom surfaces of the light-emitting elements 220a, 220b, 220c. In one embodiment, the light-reflecting layer 150 and the extension pads 132, 134 can be formed after forming the light-adjusting layer 260 (FIG. 2D) and before the step of the second separation step (FIG. 2E). Referring to FIG. 3A, the light-emitting elements 220a, 220b, 220c are adhered to another temporary carrier 252 through an adhesive layer 254 after flipping the light-emitting elements 220a, 220b, 220c over. Furthermore, the light-adjusting layer 260 is fixed by the adhesive layer 254. Moreover, the temporary carrier 212 is separated from the light-emitting elements 220a, 220b, 220c. At the same time, the light-emitting element 220a exposes electrical contacts 226a, the light-emitting element 220b exposes electrical contacts 226b, and the light-emitting element 220c exposes electrical contacts 226c.

Figure 3B:
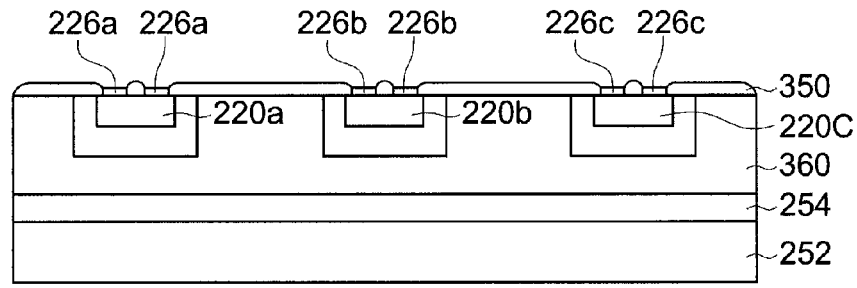

Referring to FIG. 3B, light-reflecting layers 350 are respectively formed around electrical contacts 226a, 226b, 226c of the light-emitting elements 220a, 220b, 220c. The light-reflecting layers 550 can be higher than or be level with the electrical contacts 226a, 226b, 226c. Moreover, the light-reflecting layers 350 cover a portion of the surface or the whole surface of the light-adjusting layer 360. The light-reflecting layers 350 can be formed by screen-printing or lithography.

Figure 3C:
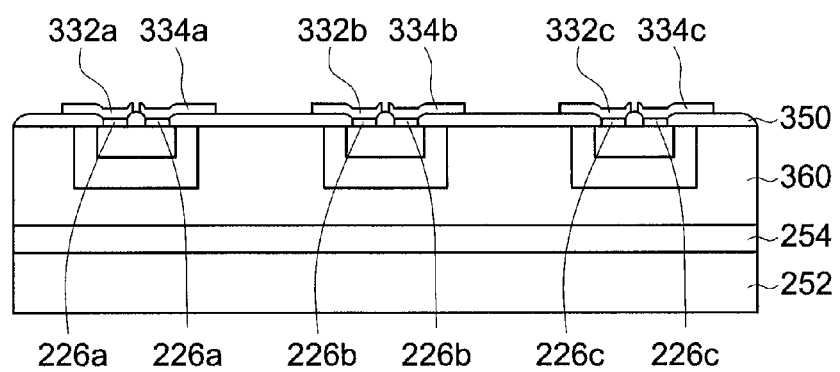

Referring to FIG. 3C, extension pads 332a, 334a are formed on the electrical contacts 226a respectively, extension pads 332b, 334b are formed on the electrical contacts 226b respectively, and extension pads 332c, 334c are formed on the electrical contacts 226c respectively. In an embodiment, the extension pads 332a, 334a and 332b, 334b and 332c, 334c are formed by electroplating. If the light-reflecting layer and/or the extension pad are not required, the step of FIG. 3A and/or FIG. 3B and/or FIG. 3C can be omitted.

Figure 3D:
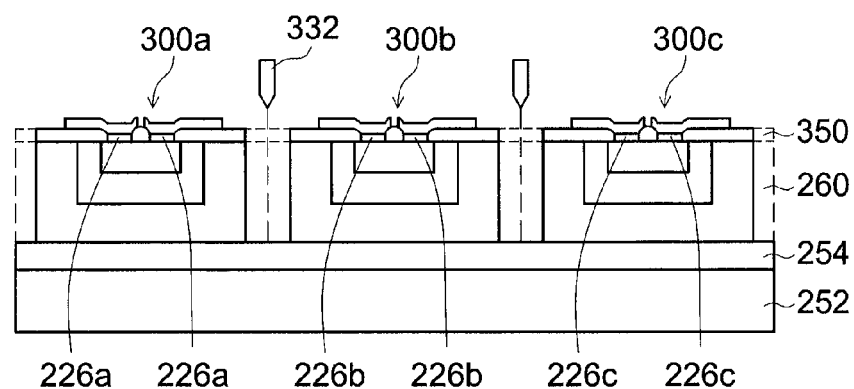

Referring to FIG. 3D, the light-reflecting layer 350 is separated from the light-adjusting layer 260 by the second separation step. What different from FIG. 2E is the electrical contacts 226a, 226b, 226c are facing up. Moreover, in an embodiment, the cutting surface exposes the light-reflecting layers 350 and the extension pads 332a, 334a, 332b, 334b, 332c, and 334c when the light-reflecting layers 350 are separated from the light-adjusting layer 360 by cutting. The light-reflecting layers 350 and the light-adjusting layer 360 are cut by the cutting tool so as to form the light-emitting devices 300a, 300b, 300c. In one embodiment, the light-reflecting layers 350 and the light-adjusting layer 360 are cut by a single cutting tool. In another embodiment, the light-reflecting layers 350 can be cut by the first cutting tool and then the light-adjusting layer 360 is cut by the second cutting tool.

Figure 4:
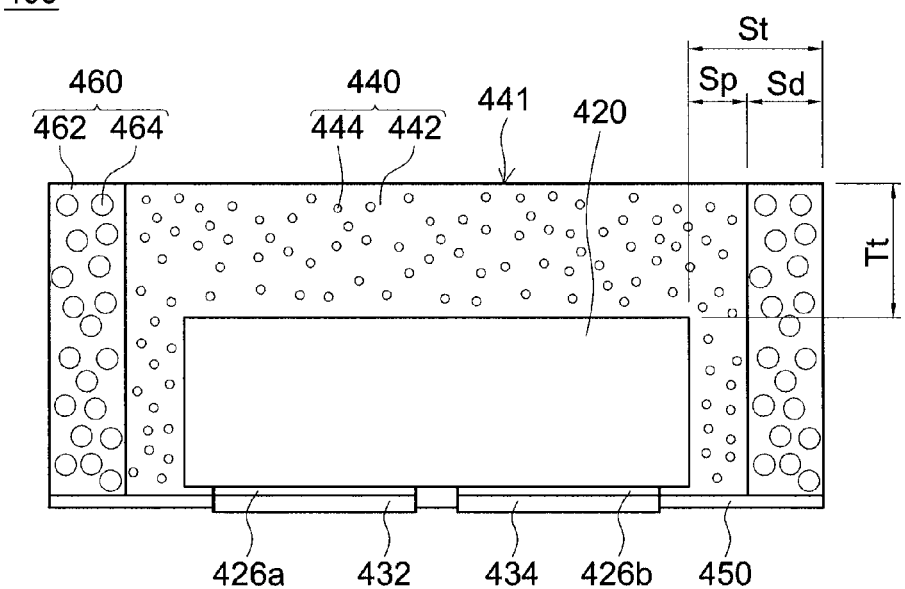
FIG. 4 is a cross-sectional view of a light-emitting device in accordance with another embodiment of the present disclosure.

FIG. 4 is a cross-sectional view of a light-emitting device 400 in accordance with another embodiment of the present disclosure. The light-emitting device 400 includes a light-emitting element 420, a wavelength conversion layer 440, and a light-adjusting layer 460. The wavelength conversion layer 440 covers a part of the surface of the light-emitting element 420. The wavelength conversion layer 440 includes a transparent binder 442 and a plurality of wavelength conversion particles 444 dispersed therein. The light-adjusting layer 460 includes a binder 462 and a plurality of light-diffusing particles dispersed 464 therein. What different from FIG. 1 is the light-adjusting layer 460 surrounds the wavelength conversion layer 440 but not covers an upper surface 441 of the wavelength conversion layer 440. In other words, the upper surface 441 of the wavelength conversion layer 440 can be exposed from the light-adjusting layer 460. In one embodiment, the upper surface 441 of the wavelength conversion layer 440 is not covered by the light-adjusting layer 460 completely. In another embodiment, a portion of the upper surface 441 of the wavelength conversion layer 440 is not covered by the light-adjusting layer 460. In one embodiment, a bottom portion of the light-emitting device 400 includes bumps 432, 434 and a light-reflecting layer 450. In one embodiment, the light-emitting element 420 has electrical contacts 426a, 426b which are located on the same side. In one embodiment, the electrical contacts 426a, 426b and the bumps 432, 434 form a stacked structure and are electrically connected to each other. The material of the bumps 432, 434 can be made of metal, such as Tin alloy or Copper. In another embodiment, the bumps can be replaced by the extension pads (not shown). In addition, the light-reflecting layer 450 surrounds two bumps 432, 434. The structures, functions and making methods of the light-emitting element 420, the wavelength conversion layer 440, the light-reflecting layer 450, and the light-adjusting layer 460 can refer to the paragraphs related with FIG. 1. When the upper surface 441 of the wavelength conversion layer 440 does not cover the light-adjusting layer 460, more first light and the second light emitted from the upper surface 441 can be scattered so the light extraction of the light-emitting device can be increased.

The total lateral thickness $S_t$ of a portion next to the light-emitting element 420 in the light-emitting device 400 is the sum of a lateral thickness $S_p$ of the wavelength conversion layer 440 and a lateral thickness $S_d$ of the light-adjusting layer 460. In one embodiment, when a weight percentage of the light-diffusing particles 464 in the light-adjusting layer 460 is not less than 20% and the total lateral thickness $S_t$ is less than 0.25 mm, the light-emitting device has a good uniformity of the color distribution over angle of view. In an embodiment, when ratios of the lateral thickness $S_p$ of the wavelength conversion layer 440 to the lateral thickness $S_d$ of the light-adjusting layer 460 is ranged from 0.8 to 1.2, the light-emitting device has a good uniformity of the color distribution over angle of view.

Figure 5A:
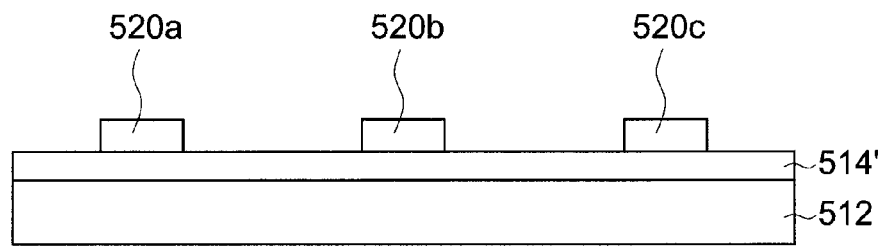
FIGS. 5A~5F are cross-sectional views of a light-emitting device in accordance with another embodiment of the present disclosure.

FIGS. 5A~5F illustrate a manufacturing flow of the light-emitting device 400 in accordance with one embodiment of the present disclosure. Referring to FIG. 5A, a temporary carrier 512, light-emitting elements 520a, 520b, 520c, and an adhesive layer 514' that can fix the light-emitting elements 520a, 520b, 520c on the temporary carrier 212 are provided. The functions and making methods of the temporary carrier 512 and the adhesive layer 514' can refer to the paragraphs related with FIG. 2A.

Figure 5B:
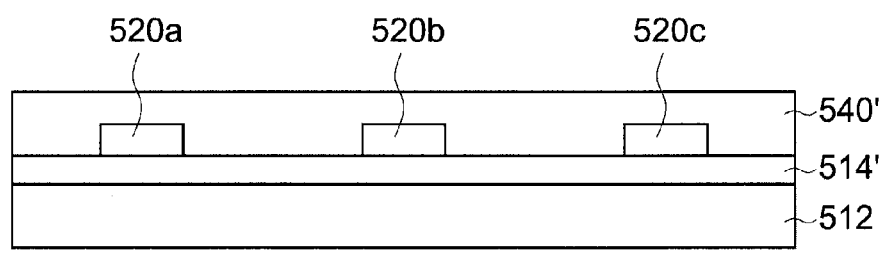
Figure 5C:
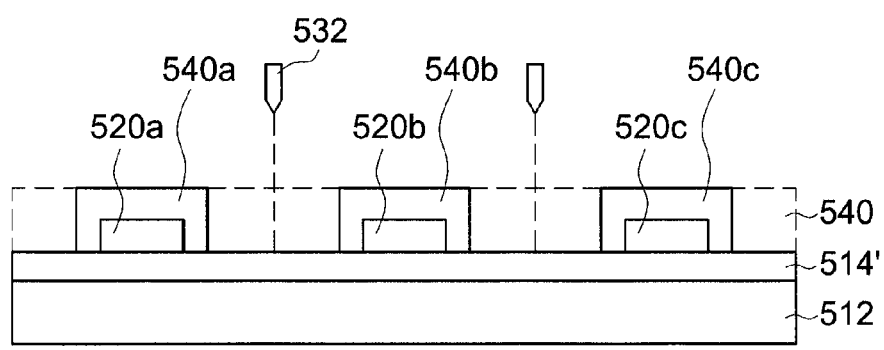

Referring to FIG. 5B, a wavelength conversion sheet 540' is formed on the adhesive layer 514' and covers the light-emitting elements 520a, 520b, 520c. Referring to FIG. 5C, the wavelength conversion sheet 540 is divided into a plurality of wavelength conversion layers 540a, 540b, 540c by a separation step. The description of the functions and making methods of the wavelength conversion sheet 540' and the plurality of wavelength conversion layers 540a, 540b, 540c can refer to the paragraphs related with FIGS. 2B and 2C.

Figure 5D:
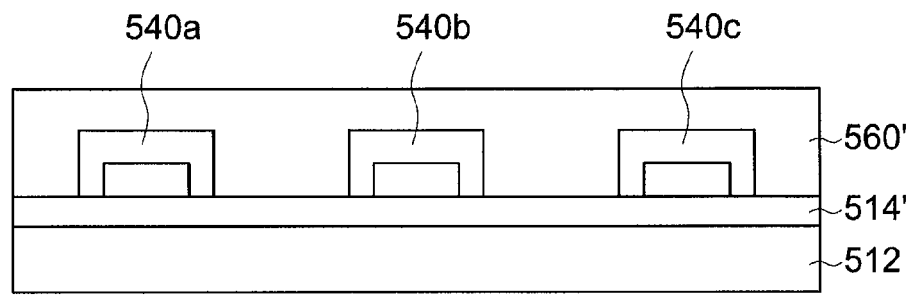

Referring to FIG. 5D, a light-adjusting layer 560' is formed on the wavelength conversion sheets 540a, 540b, 540c and the temporary carrier 512. The description of the functions and making methods of the light-adjusting layer 560' can refer to the paragraphs related with FIG. 2D.

Figure 5E:
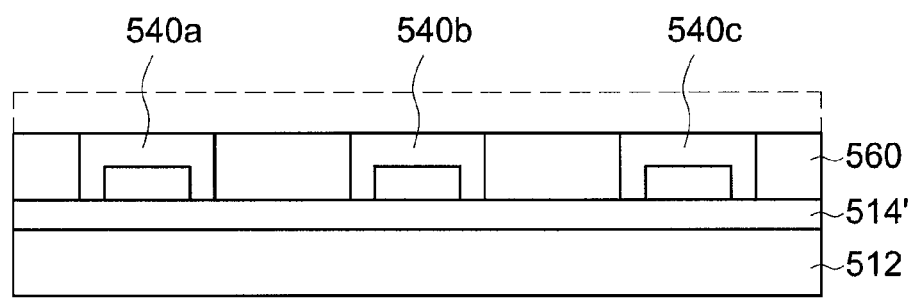

Referring to FIG. 5E, a thickness of the light-adjusting layer 560 is reduced to expose the wavelength conversion layers 540a, 540b, 540c. In one embodiment, before reducing the thickness of the light-adjusting layer 560, the light-adjusting layer 560' is cured by heating. The light-adjusting layer 560' after heating is in the full curing status and transforms to the light-adjusting layer 560. In one embodiment, the method of reducing the thickness of the light-adjusting layer 560 is cutting the light-adjusting layer 560 back and forth with a cutting tool to gradually reduce its thickness to the desired thickness. In another embodiment, the method of reducing the thickness of the light-adjusting layer 560 is deflash, such as water jet deflash or wet basting deflash.

Figure 5F:
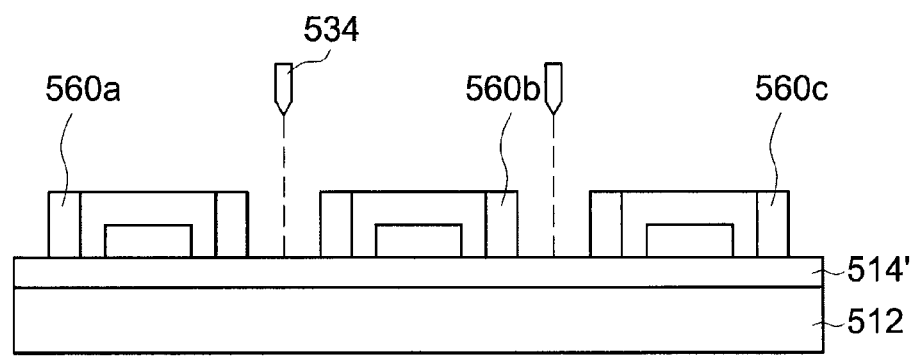

Referring to FIG. 5F, the light-adjusting layer 560 is divided into a plurality of light-adjusting layers 560a, 560b, 560c by a second separation step. The description of making methods of separating the light-adjusting layer 560 and a cutting tool 534 can refer to the paragraphs related with FIG. 2E.

Figure 6:
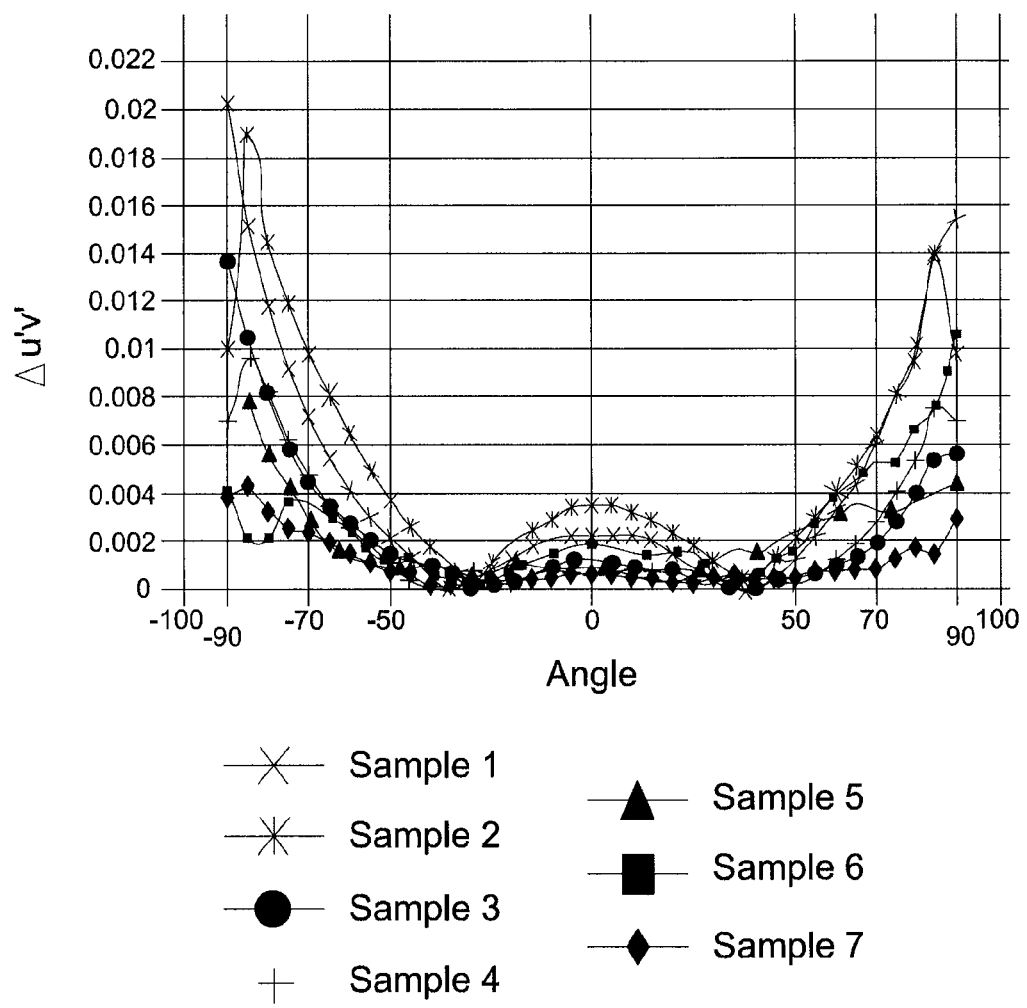
FIG. 6 is the divergence of the color coordinate as a function of the angle of view in accordance with one embodiment of the present disclosure.

FIG. 6 illustrates the divergence of the color coordinate Δu'v' as a function of the angle of view of a light-emitting device 100 disclosed in FIG. 1A with seven samples. Smaller value of Δu'v' indicates a better uniformity of the color distribution over angle of view. The total top thickness $T_t$ of the individual sample is about 0.3 mm. A ratio of the upper thickness $T_p$ to the upper thickness $T_d$ (hereinafter referred to as $T_p/T_d$) is about 0.5. $T_p/T_d$ in samples 2, 3 and 4 are about 1.0. $T_p/T_d$ in samples 5, 6 and 7 are about 2.0. A weight percentage of the light-diffusing particles in sample 1, sample 4 or sample 7 is about 40%. A weight percentage of the light-diffusing particles in sample 2 or sample 5 is about 20%. A weight percentage of the light-diffusing particles in sample 3 or sample 6 is about 30%.

For sample 1 to sample 7, Δu'v' is less than 0.010 when the angle of view is in a range of 0° to 70° (or 0° to −70°). Especially, for sample 5, 6 or 7, Δu'v' is less than 0.004 when the angle of view is in a range of 0° to 70° (or 0° to −70°). For sample 7, Δu'v' can remain smaller than 0.004 when the angle of view is in a range of 0° to 90° (or 0° to −90°). Moreover, taking sample 5 and sample 7 for example, when $T_p/T_d$ is the same, Δu'v' of sample 7 which has a greater weight percentage of the light-diffusing particles (40%) is less than that of sample 5 which has a smaller weight percentage of the light-diffusing particles (20%).

Figure 7A:
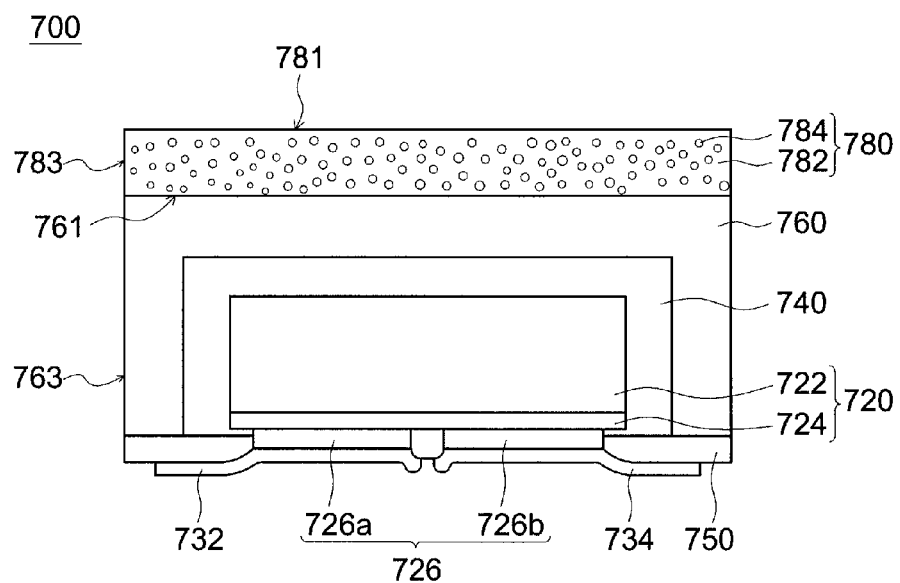
FIG. 7A is a cross-sectional view of a light-emitting device in accordance with another embodiment of the present disclosure.

FIG. 7 is a cross-sectional view of a light-emitting device 700 in accordance with another embodiment of the present disclosure. The light-emitting device 700 includes a light-emitting element 720, a wavelength conversion layer 740, a light-adjusting layer 760, extension pads 732, 734, and a light-reflecting layer 750. The light-emitting element 720 has a supporting substrate 722, a light-emitting layer 724, and electrical contacts 726, 726a, 726b. The difference comparing with FIG. 1 is there is a color-presenting layer 780 covering the light-adjusting layer 760. In one embodiment, the color-presenting layer 780 only covers an upper surface 761 of the light-adjusting layer 760 and exposes a lateral surface 763 of the light-adjusting layer 760.

Figure 7B:
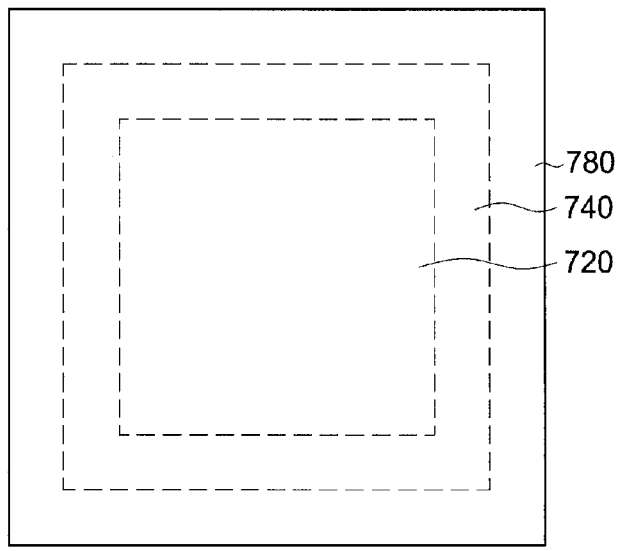
FIG. 7B is a top view of the light-emitting device shown in FIG. 7A.

The color-presenting layer 780 can express and show color of the appearance in the light-emitting device 700. In one of the embodiments in the light-emitting device 100, such as the one shown in FIG. 1A, the light-adjusting layer 160 of the light-emitting device 100 is transparent or translucent so the color of the light-emitting device 100 we see belongs to the wavelength conversion layer 140 in the device. If the wavelength conversion layer 140 contains yellow phosphor, the color we see is yellow. Therefore, in one embodiment disclosed in FIG. 7A, the color-presenting layer 780 is white so a top surface 781 of the light-emitting device 700 is also white. FIG. 7B shows a top view of the light-emitting device 700, which is basically only the color-presenting layer 780 to be seen, but not or almost not the light-emitting element 720 and the wavelength conversion layer 740. If the color of the color-presenting layer 780 can be the same or similar to the color of appearance of the electronic product, it is not easy to perceive the presence of the light-emitting device 700 so the sense of the whole of the electronic product is increased. Moreover, the color-presenting layer 780 can change the beam angle and the distribution of the light intensity. Because the light moving toward the top surface 761 of the light-emitting device 700 is blocked by the color-presenting layer 780 to decrease the light intensity above the top surface 761. Furthermore, the color-presenting layer 780 can increase the light in the direction from the lateral surface 763 so light intensity of the small angle and that of the large angle have a distribution evenly in the light-emitting device 700.

In one embodiment, the light-emitting device 700 is used for the flash device in the electronic products such as mobile phone. In one embodiment, color of the color-presenting layer 780 in the light-emitting device 700 is the same or similar to that of the appearance of the electronic products (not shown). In another embodiment, in the same environment, the light-emitting device 700 (view from a side of the color-presenting layer 780) and that of the appearance of the electronic product have the same H values while a difference of their V values is less than 20 in HSV color spaces. Here H stands for Hue, S stands for Saturation, and V stands for Value or Brightness. In another embodiment, the light-emitting device 700 (view from a side of the color-presenting layer 780) and that of the appearance of the electronic product have the same H values while a difference of V values is not greater than 10 in HSV color spaces. In one embodiment, H value (H1) of the light-emitting device 700 (view from a side of the color-presenting layer 780) is 0, S value (S1) thereof is ranged from 0 to 5, V value (V1) thereof is ranged from 90 to 100. For the appearance of the electronic product, H value (H2) is 0 near the light-emitting device 700, S value (S2) thereof is ranged from 0 to 5, and V value (V2) thereof is ranged from 90 to 100.

The color-presenting layer 780 can include binder 782 and a plurality of colorant 784 distributed in the binder 782. In one embodiment, types of the binder 782 in the color-presenting layer 780 can be the same or similar to the binder (not shown) of the light-adjusting layer 760. In one embodiment, the binder 782 of the color-presenting layer 780 and that of the light-adjusting layer 760 are both silicone resin. The type of the colorant 784 can be changed according to the desired color, such as white, silver, gold, yellow, blue, red or black. In one embodiment, the main color of the appearance of the electronic products or that of a portion close to the light-emitting device is white. Therefore, the colorant 784 of the color-presenting layer 780 can be white colorant. Material of the white colorant can be barium sulfate, titanium oxide or zinc oxide. In another embodiment, the colorant 784 of the color-presenting layer 780 can be silver, gold, yellow, blue, or red colorant. Material of the silver colorant can be AlN. Material of the gold colorant can be a multi-layer with mica and the titanium oxide. Material of the yellow colorant can be lead chromate or zinc chromate. Material of the blue colorant can be blue iron or cobalt blue. Material of the red colorant can be iron oxide red or molybdate red. Material of the black colorant can be carbon black or iron oxide black. The weight percentage of the colorant 784 can be adjusted according to the desired color, such as the saturation of the color or brightness thereof. In one embodiment, the weight percentage of the colorant 784 to the color-presenting layer 780 is ranged from 1% to 7%. In another embodiment, the weight percentage of the colorant 784 is ranged from 2% to 5%. When the weight percentage of the colorant 784 is greater than 7%, the light intensity of the light-emitting device 700 is decreased because the light is scattered by the colorant 784 and is absorbed when the light emits toward into the light-emitting device 700. In one embodiment, the thickness of the color-presenting layer 780 can be ranged from 0.05 mm to 0.400 mm. The thickness of the color-presenting layer 780 can be 0.06 mm, 0.08 mm, 0.100 mm, 0.150 mm, 0.200 mm, 0.300 mm or 0.350 mm.

The light-emitting device 700 has a good uniformity of the color distribution over angle of view and the quality of the whole appearance of the electronic products can be improved because the color of the color-presenting layer 780 is close to that of the appearance of the electronic products. Moreover, the color-presenting layer 780 can also uniform the light distribution between the small angle and the large angle in the light-emitting device 700.

Figure 8A:
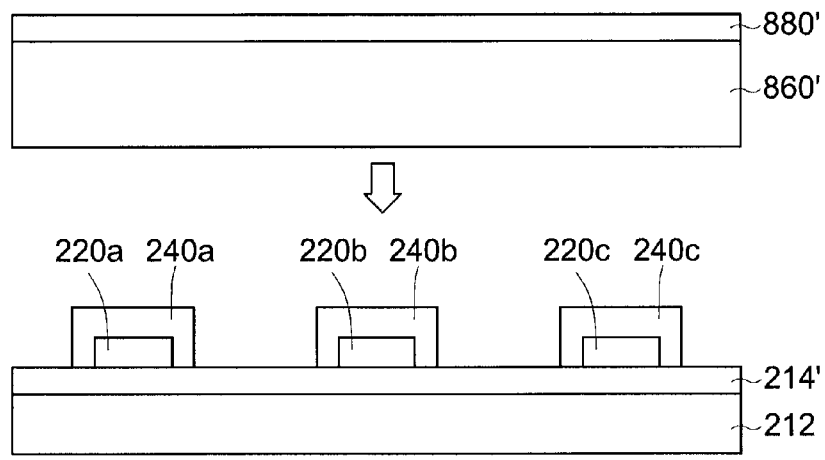
FIGS. 8A~8E illustrate a manufacturing flow of the light-emitting device in accordance with another embodiment of the present disclosure.

FIGS. 8A~8E illustrate a manufacturing flow of the light-emitting device 700 in accordance with one embodiment of the present disclosure. Referring to FIG. 8A, the temporary carrier 212, the light-emitting elements 220a, 220b, 220c, and the adhesive layer 214' are provided. The light-emitting elements 220a, 220b, 220c are covered by the plurality of wavelength conversion layers 240a, 240b, 240c, respectively. The making methods of the plurality of wavelength conversion layers 240a, 240b, 240c can refer to the paragraphs related with FIGS. 2B and 2C. Moreover, the light-adjusting layer 860' and the color-presenting layer 880' are provided.

Figure 8B:
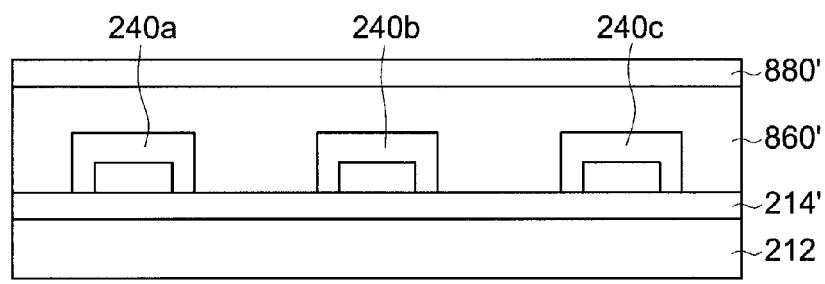

Referring to FIG. 8B, the light-adjusting layer 860' and the color-presenting layer 880' are formed together on the plurality of wavelength conversion layers 240a, 240b, 240c and cover individual upper surface of the plurality of wavelength conversion layers 240a, 240b, 240c and individual lateral surface thereof. In another embodiment, the light-adjusting layer 860' and the color-presenting layer 880' can be sequentially formed on the plurality of wavelength conversion layers separately. In another embodiment, before or at the moment of forming the light-adjusting layer 860' and the color-presenting layer 880' on the wavelength conversion layers 240a, 240b, 240c, the binders (not shown) of the light-adjusting layer 860' and the color-presenting layer 880' are semi-curing or B-stage resin. The light-adjusting layer 860' and the color-presenting layer 880' are then cured to form a light-adjusting layer 860 and a color-presenting layer 880 by energy. At this stage, the binders (not shown) of the light-adjusting layer 860 and the color-presenting layer 880 are fully cured or C-stage resin. In one embodiment, the binders of the light-adjusting layer 860 and the color-presenting layer 880 are cured by heating. When the binders of the light-adjusting layer 860 and the color-presenting layer 880 are cured, the adhesive strength between the light-adjusting layer 860 and the color-presenting layer 880 can be increased. In another embodiment, the binders of the light-adjusting layer 860 and the color-presenting layer 880 are cured by UV light or other lights.

Figure 8C:
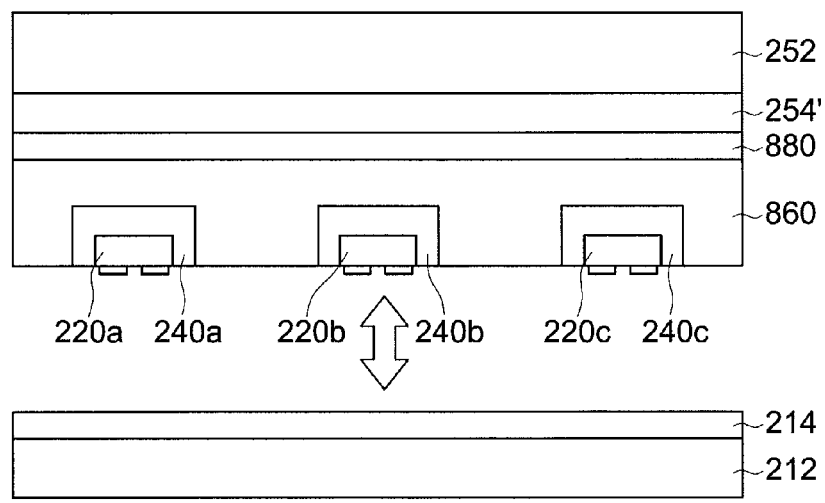

Referring to FIG. 8C, the light-emitting elements 220a, 220b, 220c are separated from the temporary carrier 212. In one embodiment, before the step of separating the light-emitting elements 220a, 220b, 220c and the temporary carrier 212, the color-presenting layer 880 is attached to the other temporary carrier 252 by the adhesive layer 254', and then the light-emitting elements 220a, 220b, 220c, the wavelength conversion layers 240a, 240b, 240c, the light-adjusting layer 860 and the color-presenting layer 880 are separated from the temporary carrier 212. At current step, the electrical contacts 226a, 226b are exposed by the separated surfaces of the light-emitting elements 220a, 220b, 220c. In one embodiment, the adhesive layer 214' can be pre-heated to decrease or eliminate the stickiness before separation.

Figure 8D:
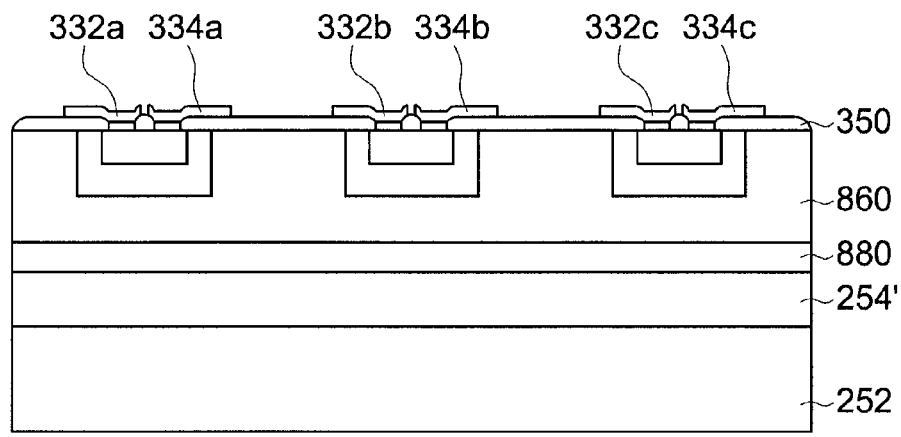

In one embodiment, if the light-emitting device does not need the extension pads and the light-reflecting layer, the light-adjusting layer 860 and the color-presenting layer 880 can both be separated to form a plurality of light-emitting device (not shown). The description of the separation methods can refer to the paragraphs related with FIGS. 2E or 3D. In another embodiment, if the light-emitting device needs the extension pads and the light-reflecting layer, as FIG. 8D illustrates, the light-reflecting layer 350 is formed around the electrical contacts 226a, 226b, 226c, the extension pads 332a, 334a are formed on the electrical contacts 226a, the extension pads 332b, 334b are formed on the electrical contacts 226b, and the extension pads 332c, 334c are formed on the electrical contacts 226c. The description of the manufacturing methods can refer to the paragraphs related with FIGS. 3B and 3C.

Figure 8E:
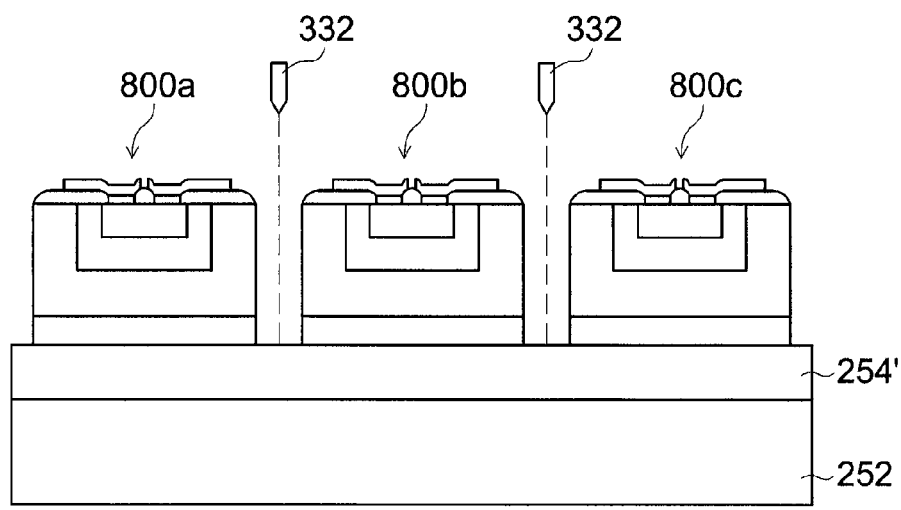

Referring to FIG. 8E, the light-reflecting layer 350, the light-adjusting layer 860 and the color-presenting layer 880 are all separated to form light-emitting devices 800a, 800b, 800c. The description of the separation methods can refer to the paragraphs related with FIG. 3D. In one embodiment, the light-reflecting layer 350, the light-adjusting layer 860, and the color-presenting layer 880 are separated by one cutter. Afterward, the light-emitting devices 800a, 800b, 800c are transferred to another temporary carrier or a reel (not shown). Moreover, in order to avoid the color-presenting layer 880 being stuck to the picking apparatus during the pick-up process, a stick-resisting treatment can be performed on the surface of the color-presenting layer 880. In one embodiment, the method of the stick-resisting treatment can be physical way, such as removing the surface layer of the color-presenting layer 880 by a scraper so as to remove the remaining glue of the color-presenting layer 880. Moreover, a surface of the color-presenting layer 880 has a greater roughness so as to be less sticky because air exists between the picking apparatus and the color-presenting layer 880.

Figure 9A:
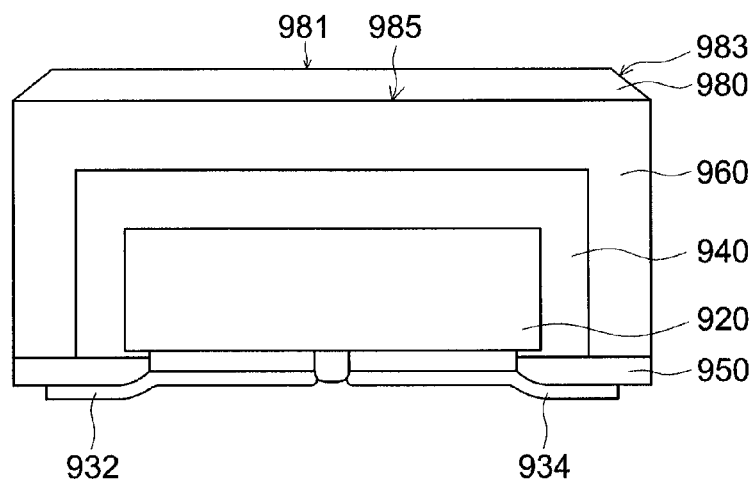
FIG. 9A is a cross-sectional view of a light-emitting device in accordance with another embodiment of the present disclosure.
Figure 9B:
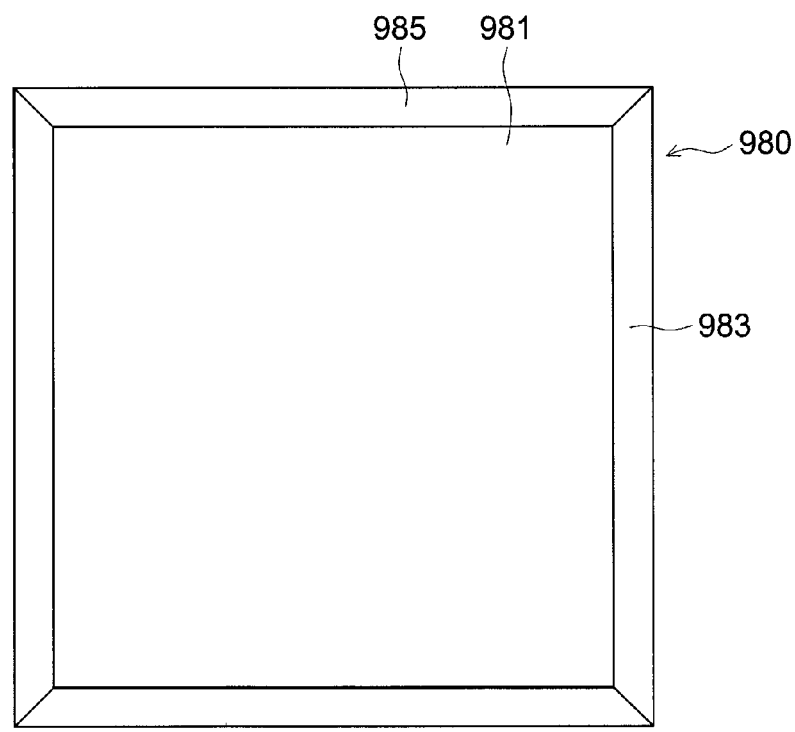
FIG. 9B is a top view of the light-emitting device shown in FIG. 9A.

FIGS. 9A and 9B are cross sectional views of a light-emitting device 900 and a top view thereof in accordance with one embodiment of the present disclosure. The light-emitting device 900 includes a light-emitting element 920, a wavelength conversion layer 940, a light-adjusting layer 960, a color-presenting layer 980, extension pads 932, 934 and a light-reflecting layer 950. Moreover, an area (or width) of a top surface 981 in the color-presenting layer 980 is different from that of a bottom surface 985. In one embodiment, a lateral surface 983 of the color-presenting layer 980 is an inclined plane which inclines inward from the bottom surface 985 to the top surface 981. Therefore, the light in the lateral side and the edge of the color-presenting layer 980 upward can be increased so the distribution of light intensity in the light-emitting device 900 can be more even. In one embodiment, the methods of forming the lateral surface 983 can form a desired shape by a cutter or a laser.

Besides the light-emitting device 900 has a good uniformity of the color distribution over angle of view, the quality of the whole appearance in the electronic products can be improved because the color of the color-presenting layer 980 is close to that of the appearance of the electronic products. Furthermore, the color-presenting layer 980 can uniform the light distribution in overall emitting angles and decrease the darker area above the top surface 981 of the light-emitting device 900.

Figure 10:
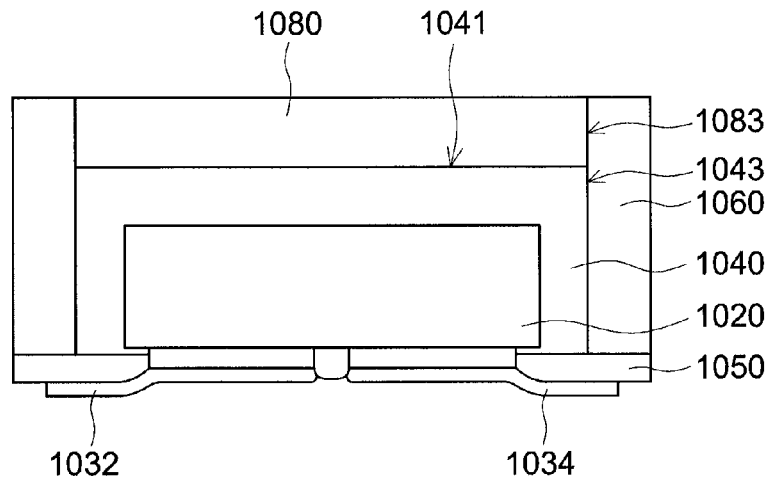
FIG. 10 is a cross-sectional view of a light-emitting device in accordance with another embodiment of the present disclosure.

FIG. 10 is a cross-sectional view of a light-emitting device 1000 in accordance with one embodiment of the present disclosure. The light-emitting device 1000 includes a light-emitting element 1020, a wavelength conversion layer 1040, a light-adjusting layer 1060, a color-presenting layer 1080, extension pads 1032, 1034, and a light-reflecting layer 1050. Furthermore, the light-adjusting layer 1060 only surrounds a lateral surface 1043 of the wavelength conversion layer 1040 and a lateral surface 1083 of the color-presenting layer 1080, but does not cover an upper surface 1041 of the wavelength conversion layer 1040.

Figure 11:
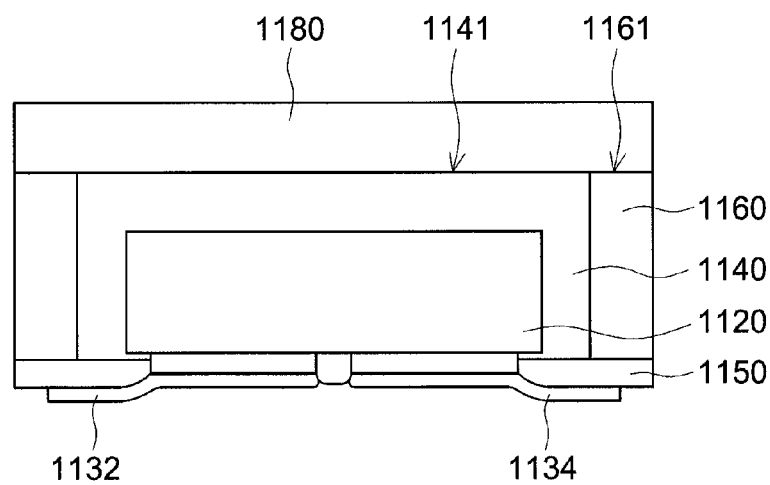
FIG. 11 is a cross-sectional view of a light-emitting device in accordance with another embodiment of the present disclosure.

FIG. 11 is a cross-sectional view of a light-emitting device 1100 in accordance with one embodiment of the present disclosure. The light-emitting device 1100 includes a light-emitting element 1120, a wavelength conversion layer 1140, a light-adjusting layer 1160, a color-presenting layer 1180, extension pads 1132, 1134, and a light-reflecting layer 1150. Furthermore, the color-presenting layer 1180 covers an upper surface 1141 of the wavelength conversion layer 1140 and an upper surface 1161 of the light-adjusting layer 1160.

It is noted that the foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:
1. A light-emitting device, comprising:
a light-emitting element, comprising a first upper surface, a bottom surface and a plurality of first lateral surfaces between the upper surface and bottom surface;
a wavelength conversion layer comprising a plurality of wavelength conversion particles and a second upper surface arranged on the first upper surface of the light-emitting element; and
a light-adjusting layer, surrounding the plurality of first lateral surfaces in a configuration of exposing the second upper surface, and comprising an inner surface and an outer lateral surface, and a first composition or a second composition wherein the light-adjusting layer allows light to enter into the inner surface, travel through the light-adjusting layer, and depart from the outer lateral surface,
wherein the first composition includes a first binder and a plurality of first light-diffusing particles, and a weight percentage of the first light-diffusing particles to the light-adjusting layer is not less than 20%; wherein the second composition includes a second binder, a plurality of second light-diffusing particles, and a plurality of light-scattering particles, a weight percentage of the second light-diffusing particles to the light-adjusting layer is not less than 5%, and a weight percentage of the light-scattering particles to the light-adjusting layer is not less than 0.4%.

2. The light-emitting device according to claim 1, wherein the weight percentage of the first light-diffusing particles is ranged from 30% to 50%.

3. The light-emitting device according to claim 1, wherein the plurality of the first light-diffusing particles has an average particle size not greater than 10μm.

4. The light-emitting device according to claim 1, wherein the plurality of the first light-diffusing particles has two particle sizes, wherein one of the average particle size is ranged from 1μm to 10μm, and the other one average particle size is ranged from 15μm to 50μm.

5. The light-emitting device according to claim 1, wherein the weight percentage of the second light-diffusing particles is ranged from 5% to 20% and that of the light-scattering particles is ranged from 0.4% to 3%.

6. The light-emitting device according to claim 1, wherein the wavelength conversion layer has an individual lateral thickness and an average lateral thickness, and a variation between the individual lateral thickness and the average lateral thickness is greater than 10%.

7. The light-emitting device according to claim 1, further comprising a outermost surface, and a distance between the outermost surface and one of the first lateral surfaces is less than 0.35 mm.

8. The light-emitting device according to claim 1, wherein the wavelength conversion layer comprising a first upper thickness and a first lateral thickness, and the first upper thickness is greater than the first lateral thickness.

9. The light-emitting device according to claim 1, wherein the wavelength conversion layer comprising a first upper thickness and the light-adjusting layer comprising a second upper thickness, and a ratio of the first upper thickness to the second upper thickness is ranged from 0.8 to 2.4.

10. The light-emitting device according to claim 1, wherein the wavelength conversion layer comprises a second lateral surface and a first lateral thickness extended from the first lateral surface to the second lateral surface, the light-adjusting layer comprises a second lateral thickness extended from the second lateral surface to the outer lateral surface, and a ratio of the first lateral thickness to the second lateral thickness is ranged from 0.2 to 0.8.

11. The light-emitting device according to claim 1, wherein the light-emitting device has a Δu'v' less than 0.0040 when the angle of view is in a range of 0° to 70°.

12. The light-emitting device according to claim 1, wherein the light-adjusting layer does not cover the second upper surface.

13. The light-emitting device according to claim 1, further comprising a color-presenting layer covering the light-adjusting layer.

14. The light-emitting device according to claim 13, wherein the light-adjusting layer comprising a second lateral surface and the color-presenting layer exposes the second lateral surface.

15. The light-emitting device according to claim 13, wherein the color-presenting layer is white.

16. The light-emitting device according to claim 13, wherein the color-presenting layer comprising a white colorant.

17. The light-emitting device according to claim 13, wherein the color-presenting layer comprises a top surface and a lower surface, and the lower surface has a width greater than that of the top surface.

18. The light-emitting device according to claim 1, further comprising a color-presenting layer covering the wavelength conversion layer and the light-adjusting layer.

19. The light-emitting device according to claim 1, wherein a difference of the refractive index between the first binder and the first light-diffusing particles is less than 0.1.

20. The light-emitting device according to claim 1, wherein a difference of the refractive index between the second binder and the second light-diffusing particles is less than 0.1.

21. The light-emitting device according to claim 1, wherein the plurality of light-scattering particles has a refractive index greater than that of the plurality of second light-diffusing particles.

22. The light-emitting device according to claim 1, wherein the plurality of light-scattering particles has a refractive index greater than that of the plurality of second light-diffusing particles of 0.5.

* * * * *